(12) United States Patent
Johnson

(10) Patent No.: US 9,520,179 B1
(45) Date of Patent: Dec. 13, 2016

(54) ASYNCHRONOUS FIFO MEMORY WITH READ AND WRITE COUNTER CIRCUITRY

(71) Applicant: Southwest Research Institute, San Antonio, TX (US)

(72) Inventor: Mark A. Johnson, Spicewood, TX (US)

(73) Assignee: SOUTHWEST RESEARCH INSTITUTE, San Antonio, TX (US)

(*) Notice: Subject to any disclaimer, the term of this patent is extended or adjusted under 35 U.S.C. 154(b) by 0 days.

(21) Appl. No.: 15/205,914

(22) Filed: Jul. 8, 2016

(51) Int. Cl.
  *G11C 7/10* (2006.01)
  *G11C 11/419* (2006.01)
  *G11C 7/22* (2006.01)

(52) U.S. Cl.
  CPC ........... *G11C 11/419* (2013.01); *G11C 7/1051* (2013.01); *G11C 7/106* (2013.01); *G11C 7/1057* (2013.01); *G11C 7/1078* (2013.01); *G11C 7/22* (2013.01)

(58) Field of Classification Search
  CPC ....... G11C 7/1051; G11C 7/1078; G11C 7/22; G11C 7/106; G11C 7/1057
  USPC ............ 365/189.05, 230.08, 233.1, 205, 221
  See application file for complete search history.

(56) References Cited

U.S. PATENT DOCUMENTS

2003/0107937 A1* 6/2003 Williams ............. G11C 7/1063
  365/221

* cited by examiner

*Primary Examiner* — Jason Lappas
(74) *Attorney, Agent, or Firm* — Livingston Law Firm

(57) ABSTRACT

A read count circuit and a write count circuit, each for providing a count of data read from or written to, respectively, an asynchronous FIFO memory device. These circuits use read/write clock and read/write enable inputs, the selection of which depend on whether a read or write count is being provided. Essentially, the circuit comprises a shift register having a number of cascaded flip-flops, where the number of flip-flops is based on a ratio of one clock frequency to the other. An AND element at the output of each flip-flop AND's the output of the associated flip-flop with a read/write enable signal. A pulse generator at the output of each AND element synchronizes the outputs of the AND elements with the read/write clock. An adder then sums the outputs of the pulse generators. A counter increments with the adder output and decrements with a read/write enable signal, upon each read/write clock signal, thereby providing a read/write count output.

6 Claims, 10 Drawing Sheets

ASYNCHRONOUS FIFO MEMORY WITH READ AND WRITE COUNTER CIRCUITRY

GOVERNMENT SUPPORT CLAUSE

This invention was made with United States Government Support under Prime Contract No. N0017310C2026, Subcontract No. 2121103302, funded by the Naval Research Laboratory. The Government has certain rights in this invention.

TECHNICAL FIELD OF THE INVENTION

The invention relates to digital memory devices, and more particularly to a FIFO memory device that provides accurate read and write counts.

BACKGROUND OF THE INVENTION

FIFO, or First In, First Out, refers to the organization and manipulation of data according to time and prioritization. Each data item is stored in a queue data structure. The first data added to the queue will be the first data to be removed. Processing proceeds sequentially in this same order. FIFO data storage has widespread application in data processing hardware.

A synchronous FIFO uses the same clock for reading and writing data. An asynchronous FIFO, however, uses separate clocks for reading and writing.

More specifically, an asynchronous FIFO refers to a FIFO design where data values are written to a FIFO buffer from one clock domain and the data values are read from the same FIFO buffer from another clock domain, where the two clock domains are asynchronous to each other. Asynchronous FIFOs have various applications, and are used to safely pass multi-bit data words from one clock domain to another clock domain.

A difficulty with asynchronous FIFOs is providing an accurate count of the words currently being stored. Status signals, such as "Full" and "Empty" are used, but in conventional FIFOs, read and write counts are merely estimates of the number of words in the FIFO. Delays from reading to write data count and from writing to read data count depend on the relative clock frequencies of read and write clocks.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

The following description is directed to a FIFO memory unit (referred to herein as a "FIFO") with asynchronous read and write clocks. The FIFO has special read and write count circuitry to maintain accurate read and write counts.

As stated in the Background, an asynchronous FIFO uses separate clocks for reading and writing. Data words are placed into a write port of the FIFO by control signals in one clock domain. These data words are read from another port of the same FIFO by control signals from a second clock domain.

A difficulty associated with asynchronous FIFOs is finding a reliable means to track the read and write counts of the number of words stored in the FIFO. Various data processing applications may benefit from an accurate count of data words written to or read from the FIFO at any given time.

Figure 1:
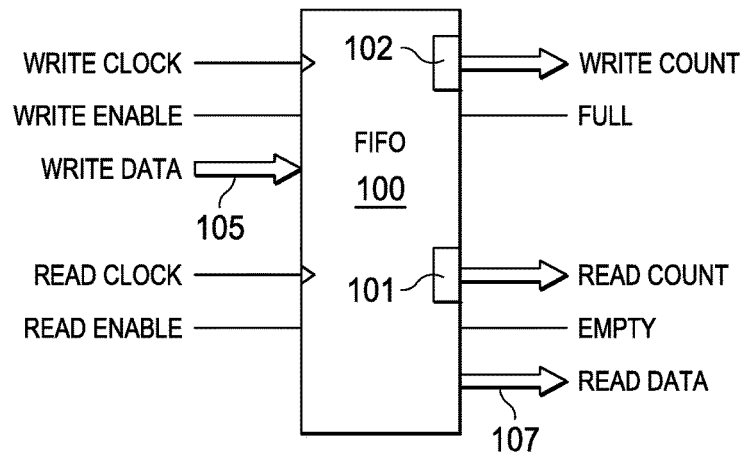
FIG. 1 illustrates a FIFO having read count and write count circuitry in accordance with the invention.

FIG. 1 illustrates an asynchronous FIFO 100, which comprises conventional data storage and control logic, as well as read count circuit 101 and write count circuit 102 in accordance with the invention.

The FIFO data storage may be static random access memory (SRAM) or any other suitable form of data storage. For FIFOs of non-trivial size, a dual-port SRAM is usually used, where one port is dedicated to writing and the other to reading. Control signals relevant to the invention are shown; FIFO 100 may have various other control signals such as pointers.

FIFO 100 is loaded from the Write Data bus 105 when the Write Enable signal is active on the rising edge of the Write clock signal. Write count circuit 102 increments a Write Count value. It also increments a Read Count value synchronous to the Read Clock signal, a minimal number of Read Clock cycles later.

FIFO 100 is read from the Read Data bus 107 when the Read Enable signal is active on the rising edge of the Read Clock signal. Read Count circuit 101 decrements the Read Count value. It also decrements a write Count synchronous to the Write Clock signal, a minimal number of Write clock cycles later.

As explained below, a feature of the invention is that read count circuit 101 and write count circuit 102 provide accurate read and write counts. Neither the read count circuit 101 nor the write count circuit 102 skips counts. The counts are accurate even with time-contiguous data transfers.

Figure 2:
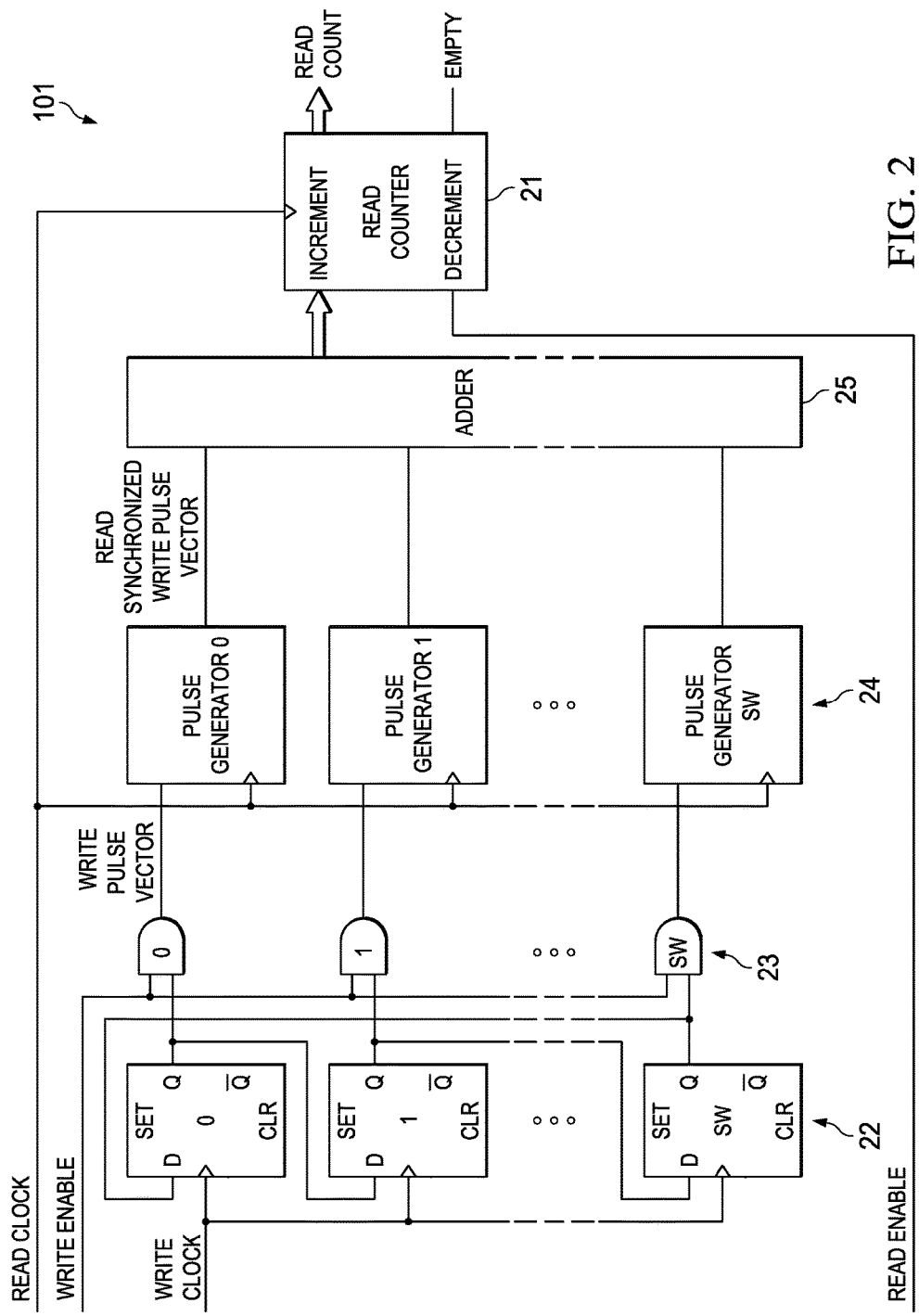
FIG. 2 illustrates read count circuitry for a FIFO whose write clock is faster than the read clock.

FIG. 2 illustrates the read count circuit 101. The primary focus of circuit 101 is generating a "read synchronized write pulse vector", whose bits are added to increment a read counter 21. As illustrated, the FIFO's clock and enable signals are used as inputs to this circuitry.

In the example of FIG. 2, the FIFO's write clock frequency is higher than that of the read clock. That is, the write clock is faster than the read clock.

A cascade of flip-flops is configured as a shift register 22, the flip-flops sharing the same write clock. In the embodiment of this description, the flip-flops are D-type flip-flops with set-reset. This is an asynchronous reset, which clears (resets) the flip-flop immediately, without waiting for a rising clock edge.

The output (Q) of each flip-flop is connected to the data (D) input of the next flip-flop in the cascade. The result is a shift register 22 that shifts by one position the 'bit array' stored in it, 'shifting in' the data present at its input and 'shifting out' the last bit in the array, at each positive transition of the write clock input. The serial input and last output of shift register 22 are connected to create a 'circular shift register'.

As indicated by the ellipses in FIG. 2, the width of the shift register 22 (the number of flip-flops) may vary. As explained below, this width (SW+1) is based on the ratio of frequencies of write clock to read clock.

The shift register 22 is "one-hot" in the sense that the legal combinations of bit values are only those with a single high (1) bit and all the others low (0).

Shift register 22 runs continuously. Each flip-flop has associated AND logic 23 at its output. The shift register outputs are bit-wise ANDed with the write enable signal.

The result of the AND logic is a Write Pulse Vector [SW:0]. The bits in this vector are also "one-hot".

Each AND element 23 has an associated pulse generator 24 at its output. The outputs of the AND elements 23 are fed to the associated pulse generators 24, synchronous to the read clock.

Figure 3:
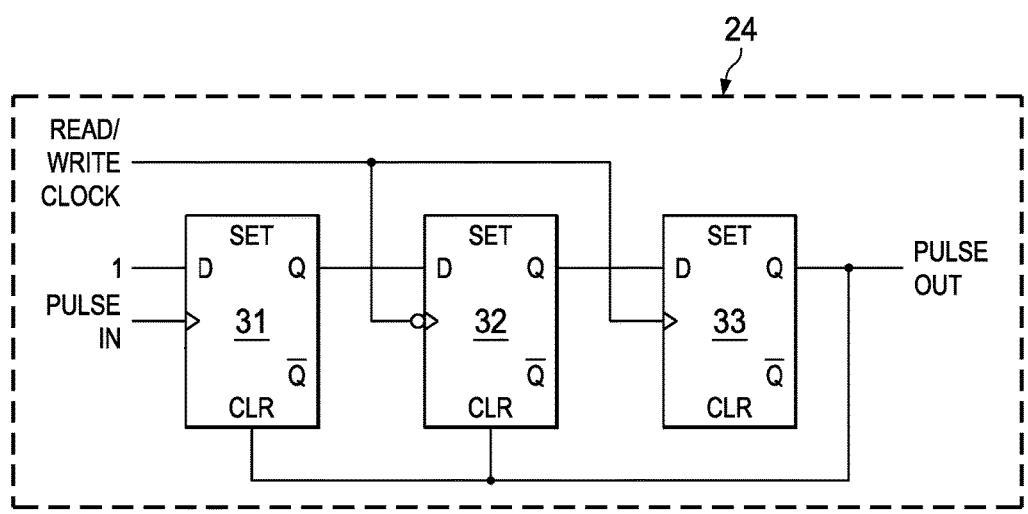
FIG. 3 illustrates the pulse generators of FIG. 2.

FIG. 3 illustrates a pulse generator 24, of which there are three or more in FIG. 2. The input pulse is delivered to a first flip-flop 31 as a clock signal, with the read clock providing the clock signal to flip-flops 32 and 33. A "1" value is provided to the data input of flip-flop 31. Flip-flops 32 and 33 receive the output of the preceding flip-flop. The result is a write pulse vector that is now read-synchronized.

Referring again to FIG. 2, the bits of the read-synchronized Write Pulse Vector are summed in adder 25. The result is a Write Pulse sum that increments the Read Counter 21.

The Read Enable signal decrements the Read Counter 21 by 1 each time it occurs, synchronous with the read clock.

Figure 4:
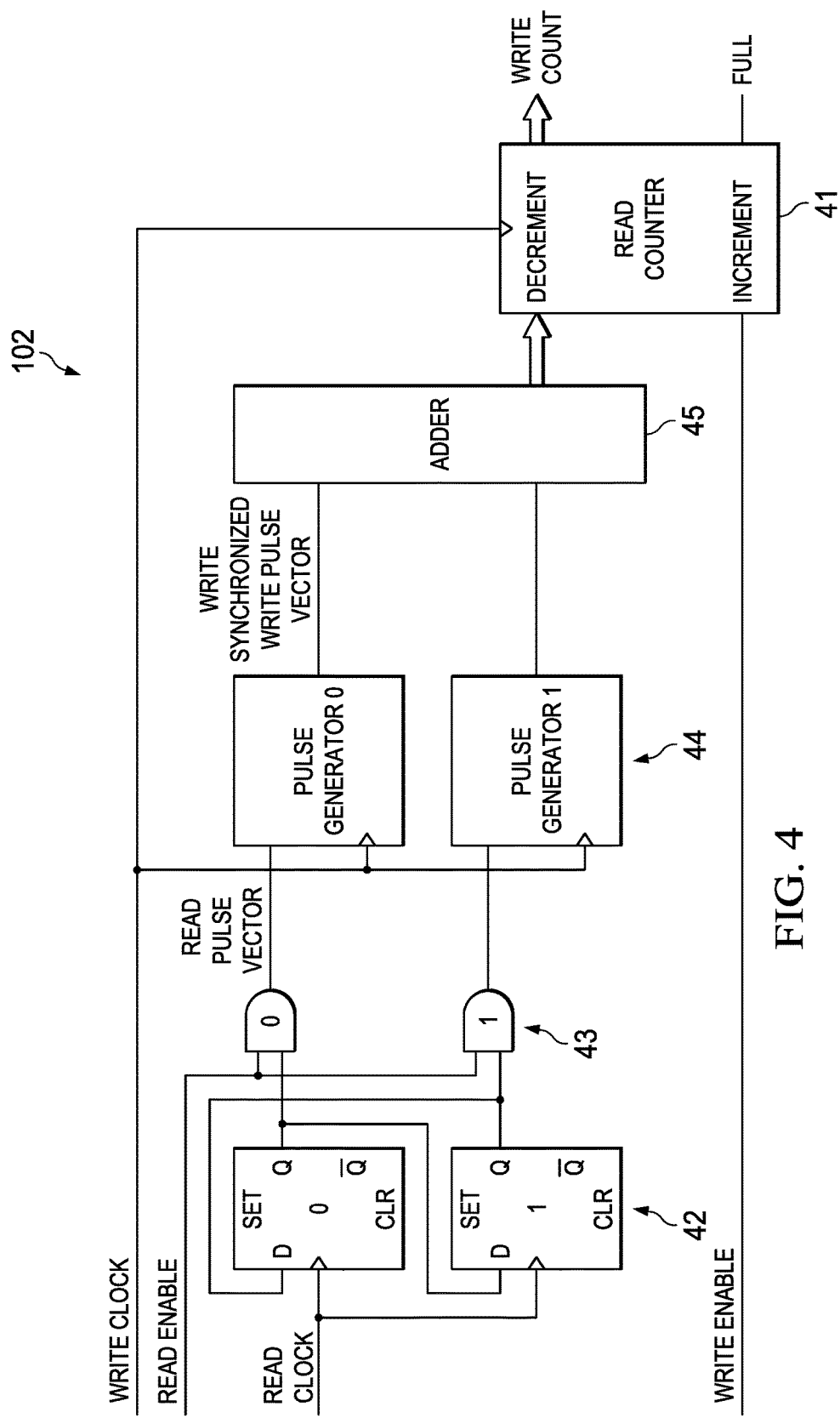
FIG. 4 illustrates the write count circuitry for a FIFO whose write clock is faster than the read clock.

FIG. 4 illustrates the write count circuitry 102 corresponding to the read count circuitry 101. In the case of the Write Clock at a higher frequency than the Read Clock as shown in FIG. 2, similar circuitry is used for generating the Write Count. However, for the write count circuitry 102, vector sizes converge to 2 (SW+1), and all the Read and Write signal names have Read and Write swapped. Shift registers 42, AND elements 43, pulse generators 44, adder 45 and write counter 41 are configured and operate similarly to like elements described above for the read count circuitry 101.

Referring to both FIGS. 2 and 4, the vectors whose size determine the size of the shift register and the number of associated AND elements and pulse generators may be referred to as [SW:0] for the write counter vectors and [SR:0] for the read counter vectors. The equations that determine the vector sizes are determined by the Write to Read Clock frequency ratios and are calculated as follows:

RATIO is the Write Clock frequency divided by the Read Clock frequency. The implemented RATIO can never be less than 0.8. A 2.5 multiplier in the following equations guarantees no overlapping in the Write Pulse Vector. Any value less than 0.8 does not satisfy that criteria.

First, a Write Clock Ratio and a Read Clock Ratio are calculated as follows:

$$\text{RATIO\_}W = \text{RATIO if RATIO} \geq 0.8, \text{ else}$$
$$\text{RATIO\_}W = 0.8$$

$$\text{RATIO\_}R = 1/\text{RATIO if } 1/\text{RATIO} \geq 0.8, \text{ else}$$
$$\text{RATIO\_}R = 0.8$$

Next, the write clock ratio and the read clock ratio are multiplied by 2.5 and summed with 0.499:

$$\text{RATIO\_25}W = \text{RATIO\_}W \times 2.5 + 0.499$$

$$\text{RATIO\_25}R = \text{RATIO\_}R \times 2.5 + 0.499$$

The resulting values are converted to an integer. Any decimal fraction less than 0.5 is rounded down; any decimal fraction greater than or equal to 0.5 is rounded up:

The size of the Write Pulse Vector is:

$$\text{SHIFT\_}W = \text{Integer}(\text{RATIO\_25}W).$$

Referring again to FIG. 2, SW is this number −1.

The size of the Read Pulse Vector is:

$$\text{SHIFT\_}R = \text{Integer}(\text{RATIO\_25}R)$$

Referring again to FIG. 4, SR is this number −1.

In FIG. 2, the number of Adder bits feeding the Read Counter 21 is Log 2(SHIFT_W) rounded up. In FIG. 4, the number of Adder bits feeding the Write Counter 41 is Log 2(SHIFT_R) rounded up.

In the above description, the write clock is at higher frequency than the read clock. If the read clock is at higher frequency than the write clock, the write count circuitry would look like that of FIG. 2 but with the "read" and "write" labels swapped. Similarly, the read count circuitry would like that of FIG. 4, but with the "read" and "write" labels swapped. Regardless of which clock is faster, the vector size for the clock with the lower frequency (the slower clock) is always the same and converges to 2.

Figure 5:
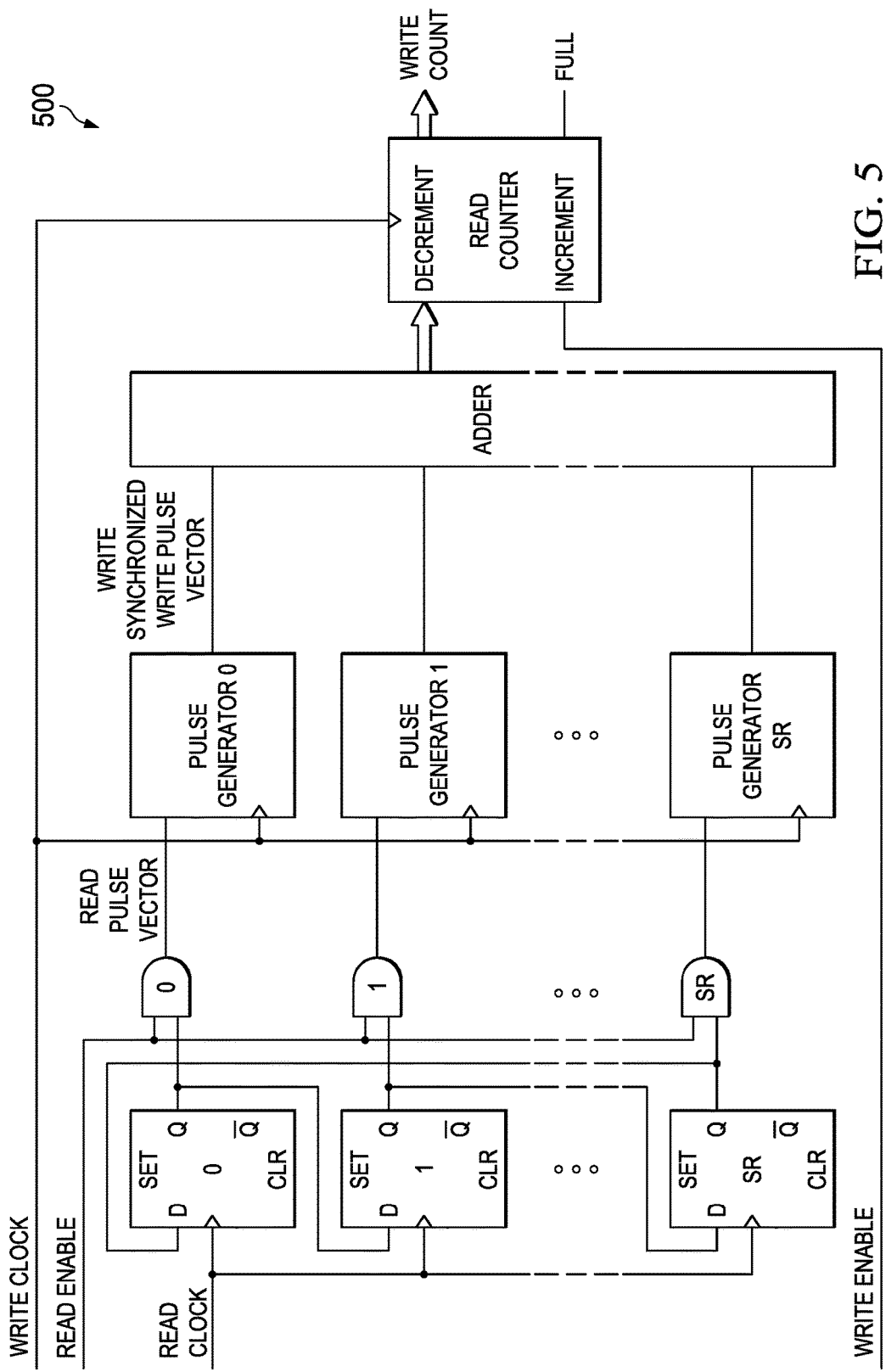
FIG. 5 illustrates write count circuitry for a FIFO whose read clock is faster than the write clock.
Figure 6:
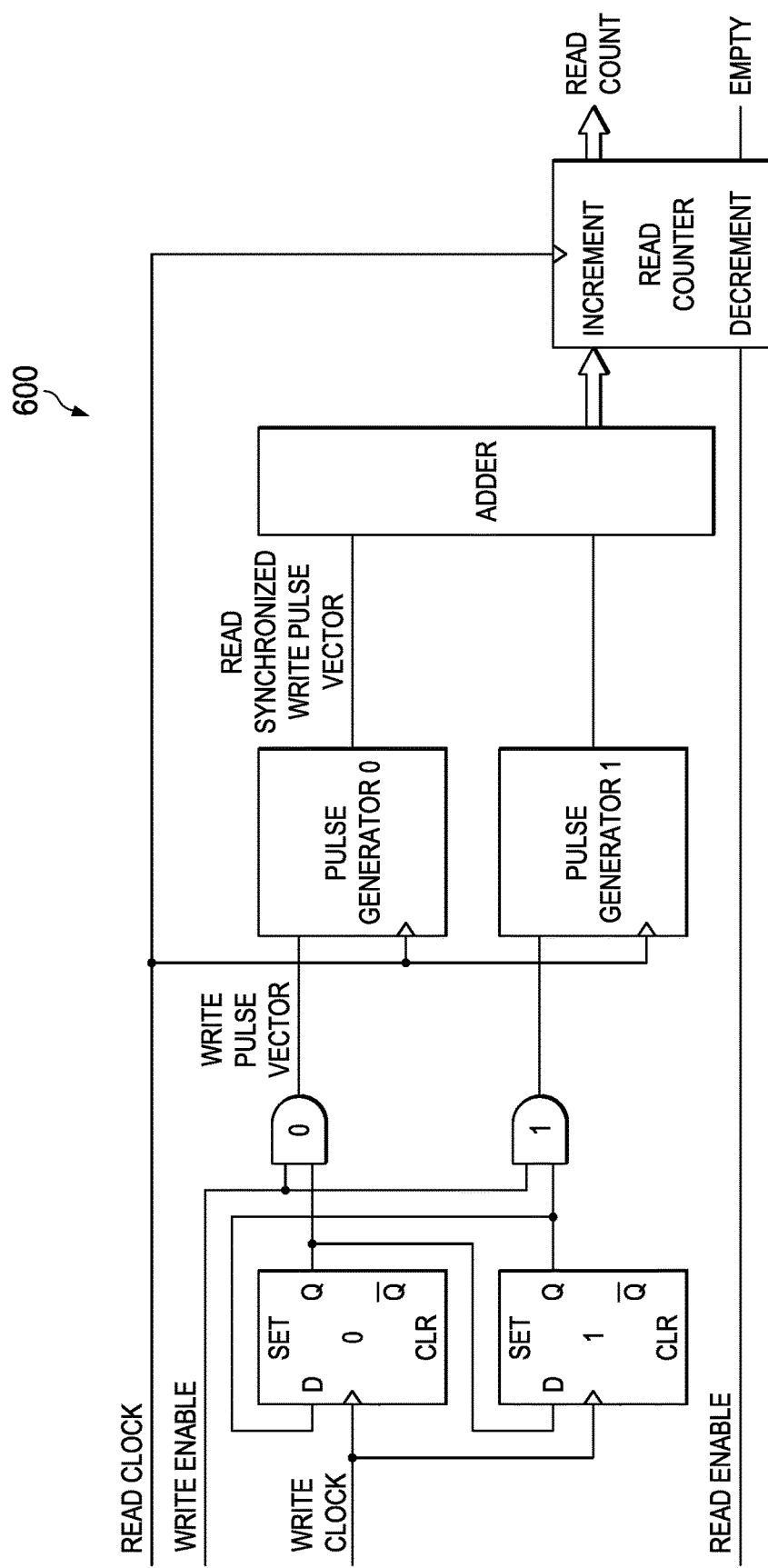
FIG. 6 illustrates read count circuitry for a FIFO whose read clock is faster than the write clock.

FIG. 5 illustrates write count circuitry 500, modified for FIFO's having their read clock faster than their write clock. FIG. 6 illustrates the corresponding read count circuitry. For both circuits, shift registers, AND elements, pulse generators, adder and read and write counters are configured and operate similarly to like elements described above. As above, for the count of the faster clock, here for the read count circuitry, the vector size converges to 2 (SW+1).

Figure 7:
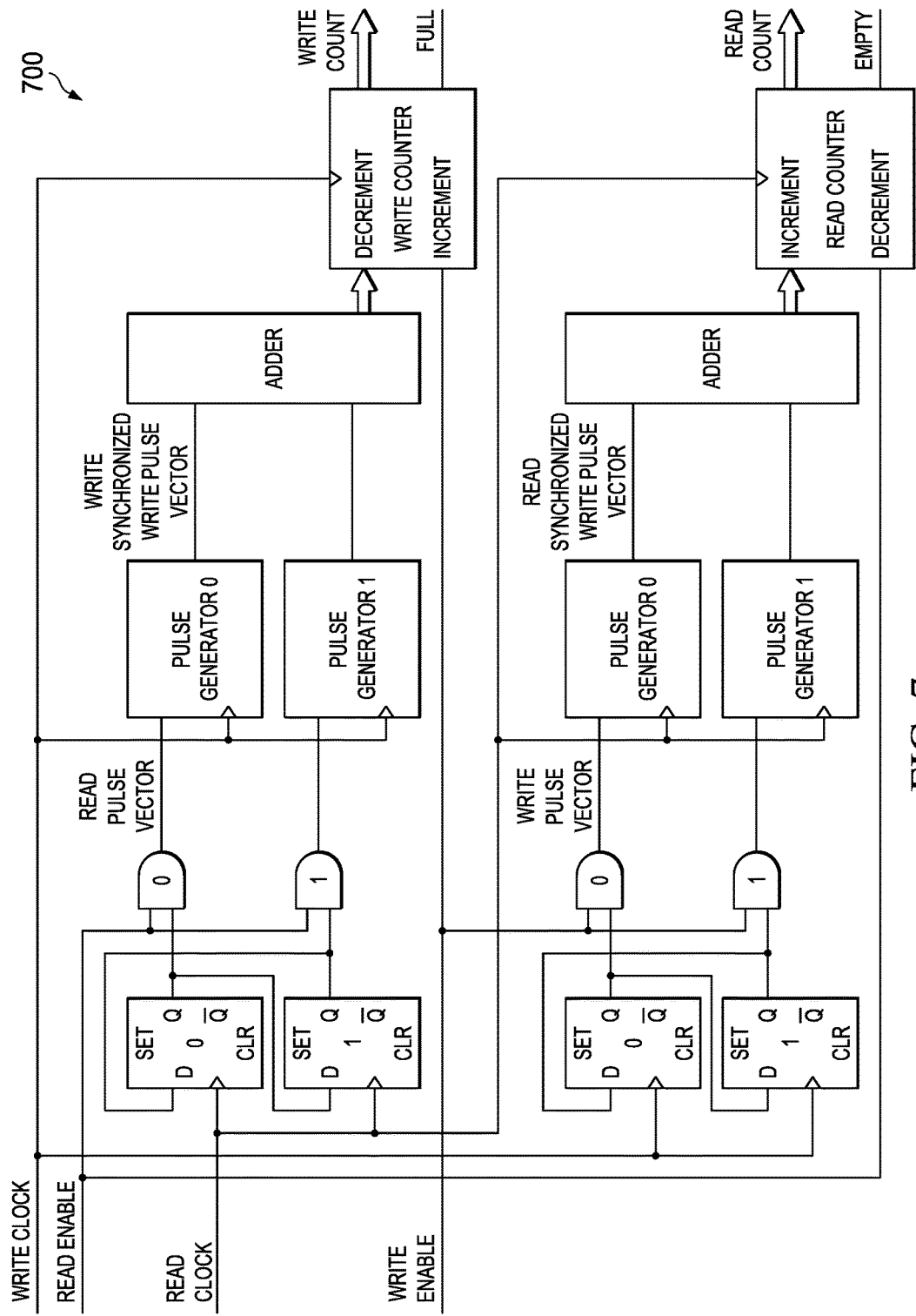
FIG. 7 illustrates the write count and read count circuitry for a FIFO whose clocks run at equal frequencies.

FIG. 7 illustrates the circuitry for both the read and write counts of an asynchronous FIFO whose clocks have equal frequencies.

Figure 8A:
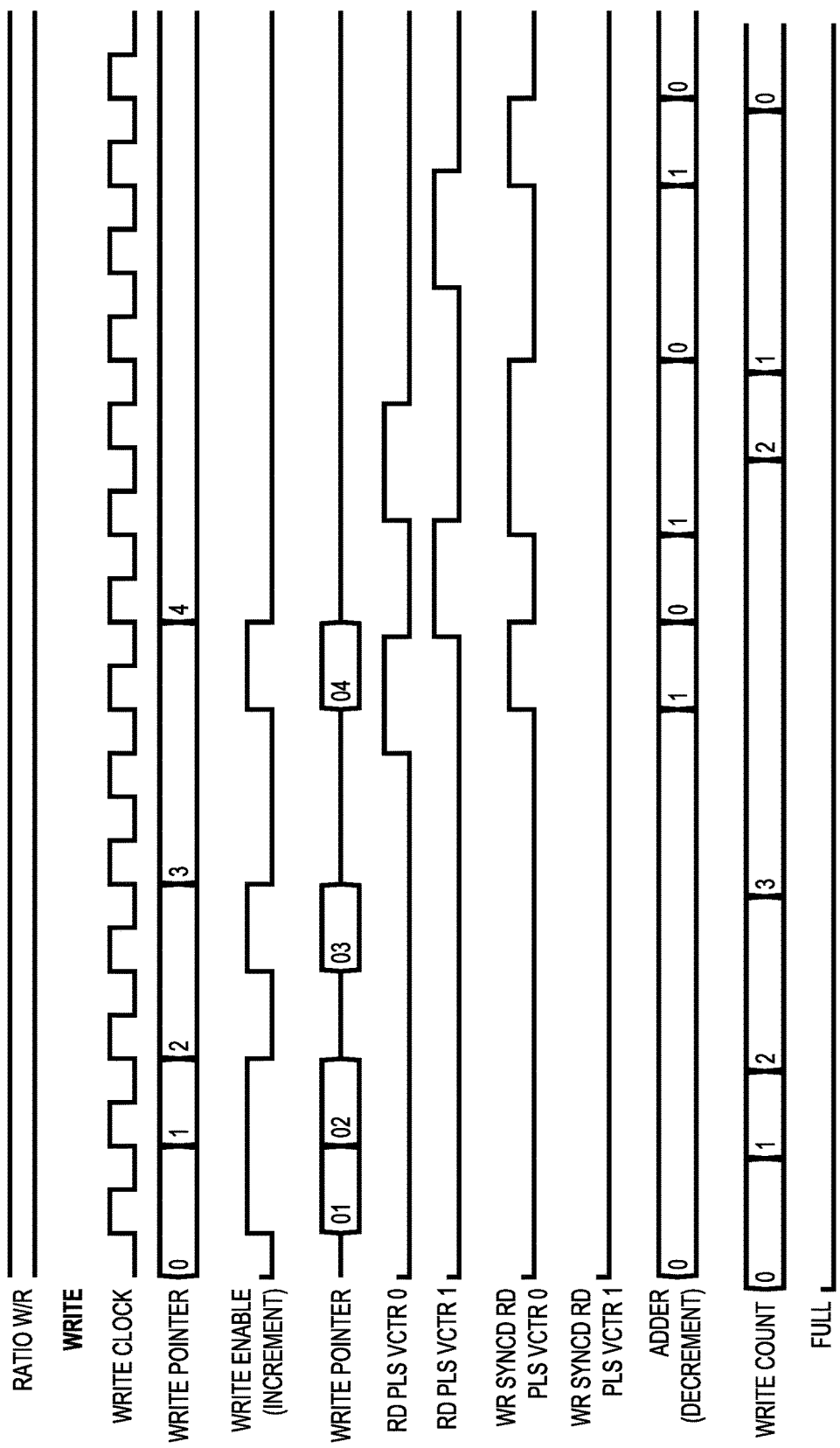
FIGS. 8A and 8B are timing diagrams of an example of operation of the read count and write count circuits of FIGS. 2 and 4.
Figure 8B:
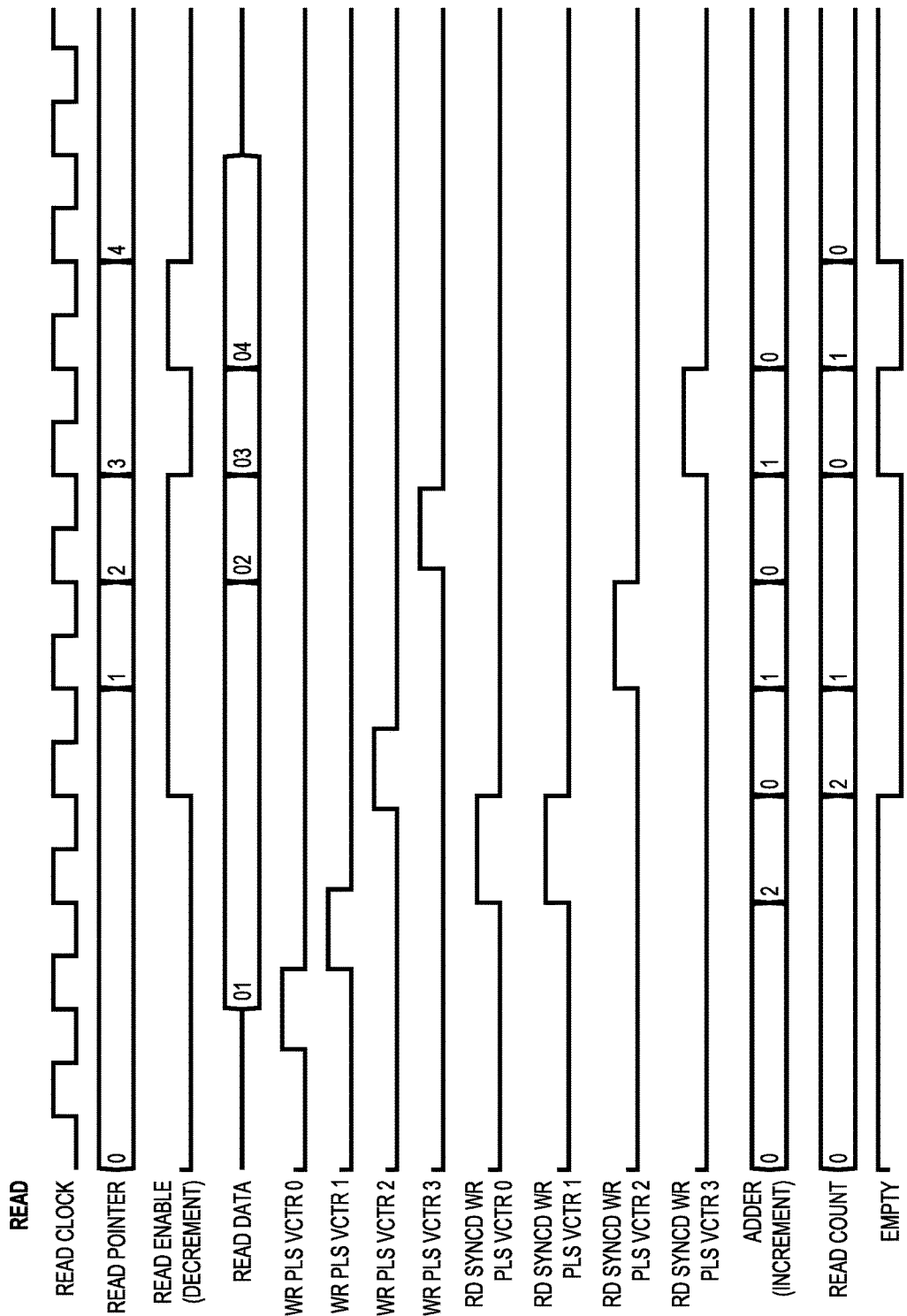

FIGS. 8A and 8B are timing diagrams of an example of operation of the circuit of FIGS. 2-4. That, is the write clock is faster than the read clock. In this example, the ratio of the write clock to the read clock is 4:3 or 1.333. In the time period shown, four data words are read in and four data words are read out of the FIFO.

For this example, using the equations set out above:

$$\text{RATIO\_}W = 1.333$$

$$\text{RATIO\_}R = 0.8$$

$$\text{RATIO\_25}W = 3.831$$

$$\text{RATIO\_25}R = 2.499$$

$$\text{SHIFT\_}W = 4$$

$$\text{SHIFT\_}R = 2$$

This provides the size of the shift register for the read counter circuitry (FIG. 2) and write counter circuitry (FIG. 4). As stated above, where SHIFT_W=4, then SW=4−1=3. The slower clock has a shift register size of 2, or SR+1.

In FIGS. 8A and 8B, the outputs of the AND elements and the pulse generators for the write count and read count circuitry are also shown. In other words, referring to FIGS. 8A and 2, values for the write pulse vector and the values for the read synchronized write pulse vector are shown. Referring to FIGS. 8B and 4, values for the read pulse vector and the values for the write synchronized read pulse vector are shown.

As shown in FIGS. 8A and 8B, the read count from read counter 21, and the write count from counter 41 are accurate during this time period.

Figure 9A:
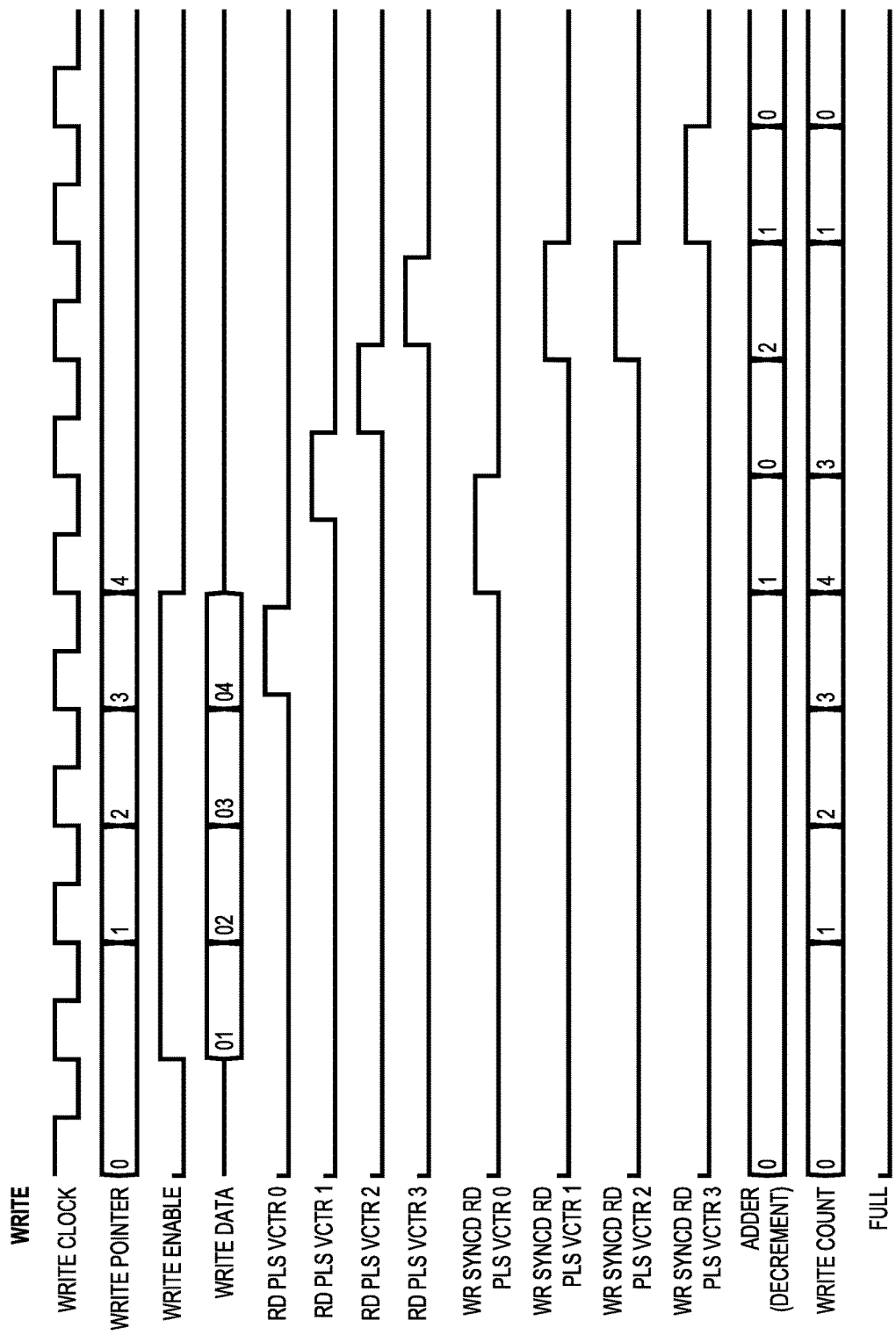
FIGS. 9A and 9B are timing diagrams of an example of operation of the read count and write count circuits of FIGS. 5 and 6.
Figure 9B:
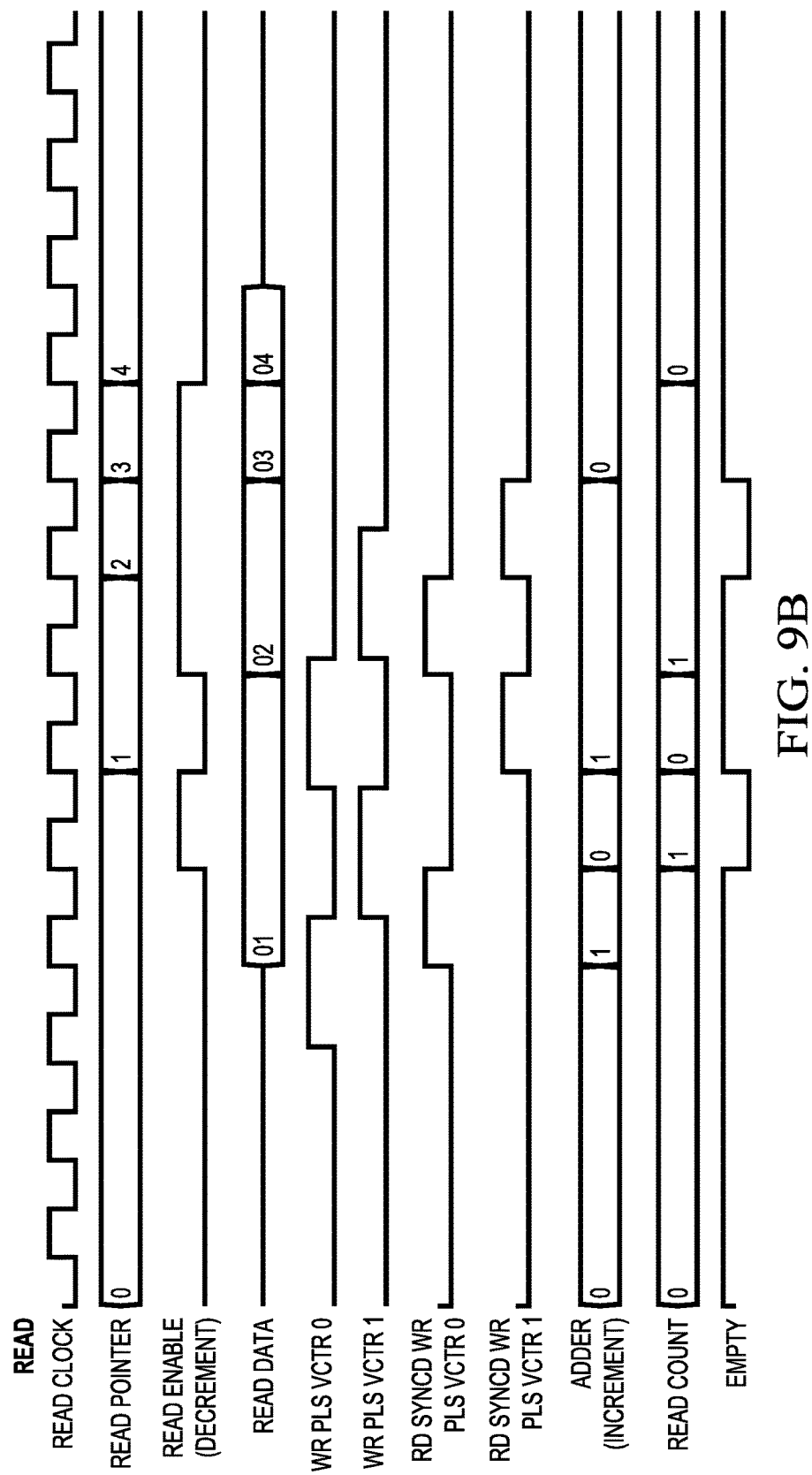

FIGS. 9A and 9B are timing diagrams for another example of asynchronous clocks. Here, the write clock is slower than the read clock. In FIGS. 9A and 9B, the write to read ratio is 3:4. As in FIGS. 8A and 8B, in the time period shown, four data words are written to and four data words are read from the FIFO.

For this example, using the equations set out above:

$$RATIO\_W = 0.8$$

$$RATIO\_R = 1.333$$

$$RATIO\_25W = 2.499$$

$$RATIO\_25R = 3.831$$

$$SHIFT\_W = 2$$

$$SHIFT\_R = 4$$

As stated above, where the write clock is slower than the write clock, the circuits of FIGS. 2-4 are modified. As also stated above, where SHIFT_R=4, then SR=4−1=3. The slower clock has a shift register size of 2, or SW+1.

In sum, FIFO 100 is operable with any clock frequency ratio, as well as with frequency matching asynchronous Read/Write Clocks. It yields a significantly small turnaround time for the count values in response to their respective enable inputs.

What is claimed is:

1. A read count circuit for providing a count of data read from an asynchronous FIFO memory device, the FIFO memory device providing a read clock signal, a write clock signal, a read enable signal, and a write enable signal, with each of the clock signals having an associated clock frequency, the circuit comprising:
    a shift register comprising a number of cascaded flip-flops, each flip-flop having the write clock signal as its clock input, and the data output of the preceding flip-flop as its data input, with the data output of the last flip-flop being the data input to the first flip-flop;
    wherein the number of flip-flops is the size of a data vector whose size is based on a ratio of one clock frequency to the other;
    an AND element at the output of each flip-flop, operable to AND the output of the associated flip-flop with the write enable signal;
    a pulse generator at the output of each AND element, operable to synchronize the outputs of the AND elements with the read clock;
    an adder operable to receive and sum the outputs of each pulse generator, thereby providing a write pulse sum; and
    a counter operable to increment with the write pulse sum and to decrement with the read enable signal upon each read clock signal, thereby providing a read count output.

2. The read count circuit of claim 1, wherein the read clock signal is faster than or the same speed as the write clock signal, and the size of the data vector is two.

3. The read count circuit of claim 1, wherein each pulse generator comprises a series of flip-flops, the first flip-flop having the output of the associated AND element as its input, and the succeeding flip-flops having the read clock as their clock input.

4. A write count circuit for providing a count of data written to an asynchronous FIFO memory device, the FIFO memory device providing a read clock signal, a write clock signal, a read enable signal, and a write enable signal, with each of the clock signal having an associated frequency, the circuit comprising:
    a shift register comprising a number of cascaded flip-flops, each flip-flop having the read clock signal as its clock input, and the data output of the preceding flip-flop as its data input, with the data output of the last flip-flop being the data input to the first flip-flop;
    wherein the number of flip-flops is the size of a data vector whose size is based on a ratio of one clock frequency to the other;
    an AND element at the output of each flip-flop, operable to AND the output of the associated flip-flop with the read enable signal;
    a pulse generator at the output of each AND element, operable to synchronize the outputs of the AND elements with the write clock;
    an adder operable to receive and sum the outputs of each pulse generator, thereby providing a read pulse sum; and
    a counter operable to decrement with the read pulse sum and to increment with the write enable signal upon each write clock signal, thereby providing a write count output.

5. The write count circuit of claim 4, wherein the write clock signal is faster than or the same speed as the read clock signal, and the size of the data vector is two.

6. The write count circuit of claim 4, wherein each pulse generator comprises a series of flip-flops, the first flip-flop having the output of the associated AND element as its input, and the succeeding flip-flops having the write clock as their clock input.

* * * * *